United States Patent
Voirin et al.

(10) Patent No.: US 10,497,183 B2
(45) Date of Patent: Dec. 3, 2019

(54) COMPUTER IMPLEMENTED METHOD FOR DESIGNING A THREE-DIMENSIONAL MODELED OBJECT COMPRISING A CURVE AND A POINT PLACE ON THE CURVE

(71) Applicant: Dassault Systemes, Velizy Villacoublay (FR)

(72) Inventors: Pierre Voirin, Trets (FR); Laurent Bianchi, Marseilles (FR)

(73) Assignee: DASSAULT SYSTEMES, Velizy Villacoublay (FR)

( * ) Notice: Subject to any disclaimer, the term of this patent is extended or adjusted under 35 U.S.C. 154(b) by 0 days.

(21) Appl. No.: 15/410,300

(22) Filed: Jan. 19, 2017

(65) Prior Publication Data

US 2017/0221275 A1 Aug. 3, 2017

(30) Foreign Application Priority Data

Jan. 29, 2016 (EP) .................................... 16305088

(51) Int. Cl.
*G06T 19/20* (2011.01)
*G06F 17/50* (2006.01)

(52) U.S. Cl.
CPC .............. *G06T 19/20* (2013.01); *G06F 17/50* (2013.01); *G06T 2219/2021* (2013.01)

(58) Field of Classification Search
None
See application file for complete search history.

(56) References Cited

PUBLICATIONS

European Search Report from European Application No. 16305088. 3, entitled: "Computer Implemented Method For Designing A Three-Dimensional Modeled Object Comprising A Curve And A Point Placed On The Curve," dated Jul. 18, 2016.
Bikas, H., et al., "Additive Manufacturing Methods And Modelling Approaches: A Critical Review," *Int. J. Adv. Manuf. Technol.*, 83:389-405 (2016).
Chen, X.-D., et al., "Computing The Minimum Distance Between A Point And A NURBS Curve," *Computer-Aided Design*, 40:1051-1054 (2008).
Ko, K. and Sakkalis, T., "Orthogonal Projection Of Points In CAD/CAM Applications: An Overview," *Journal of Computational Design and Engineering*, 1(2):116-127 (2014).
Creating Points [retrieved on Apr. 7, 2016]. Retrieved from the Internet URL: http://catiadoc.free.fr/online/cfyug_C2/cfyugpoint3D. htm.

*Primary Examiner* — Yi Wang
(74) *Attorney, Agent, or Firm* — Hamilton, Brook, Smith & Reynolds, P.C.

(57) ABSTRACT

A computer-implemented method designs a three-dimensional modeled object. The method: provides, in a three-dimensional scene, said three-dimensional modeled object comprising a curve (C) defined by a set of vertices (V1, V2, V3) and a set of edges (E1, E2) connecting said vertices. Next the method places a point (P) on the curve; stores an initial position of the point on the curve, relative to a first vertex (V2); stores an initial position of the point within the three-dimensional scene; and modifies the curve by deleting the first vertex. The method further places the point onto the modified curve (C') at a modified position (P') situated at a minimal distance from the stored initial position of the point within the three-dimensional scene.

13 Claims, 5 Drawing Sheets

COMPUTER IMPLEMENTED METHOD FOR DESIGNING A THREE-DIMENSIONAL MODELED OBJECT COMPRISING A CURVE AND A POINT PLACE ON THE CURVE

RELATED APPLICATION(S)

This application claims priority under 35 U.S.C. § 119 or 365 to European Application No. 16305088.3, filed Jan. 29, 2016. The entire teachings of the above application(s) are incorporated herein by reference.

BACKGROUND

The invention relates to a computer-implemented method for designing a three-dimensional (3D) modeled object in a three-dimensional scene, wherein the object comprises at least one curve (i.e. a curved line) and a point positioned on said curve. The invention applies in particular to the geometrical design of a physical object (e.g. an injection mold) to be manufactured.

The invention applies to the field of computer graphics, Computer Aided Design (CAD), Computer Aided Engineering (CAE) and Computer Aided Manufacturing (CAM). The invention is particularly suitable for producing three-dimensional geometrical models of physical objects in view of their manufacturing.

SUMMARY OF THE INVENTION

In a CAD system, a three-dimensional modeled object is a digital representation of a shape in three-dimensional space which may, or not, correspond to a physical object, already existing in the real world or not. Typically, a three-dimensional modeled object comprises lines, points and possibly surfaces (the latter being absent in "wire frame" models). Lines may be straight lines or curves (i.e. curved lines). Typically, a curve is defined by a set of points, called vertices, and a set of straight or curvilinear segments, called edges; each segment links a pair of vertices and conversely each vertex is connected to two other vertices by respective edges, except two extremity vertices which are connected to a single other vertex. More often than not, it is required to place a point on a curve, at a specific position. For instance, the point may represent an intersection between the curve and another line, or a surface, of the object or of the scene. Typically, the position of the point on the curve is defined by its distance, measured along the curve, from a "reference vertex". If, during the design process, the shape of the curve is modified without removing the reference vertex, the position of the point in the three-dimensional scene is recomputed to allow it following the change automatically: therefore the point remains on the curve, at the same distance from the reference vertex. In some cases, however, design changes require the deletion of some vertices of the curve ("topology changes"); if one of the deleted vertices is the reference vertex of a point, the position of the latter cannot be recomputed. The point has then to be repositioned by a direct intervention of a user of the CAD system. This is time-consuming and error-prone. Moreover, it limits the possibility of performing design changes automatically, e.g. to in order to explore a design space in an effective manner.

The invention aims at overcoming this drawback of the prior art. As design modifications are by far the most time-consuming and labor-intensive part of the design cycle of physical objects, the improvement provided by the invention will result in significant savings.

More precisely, the invention provides a method for automatically repositioning a point onto a curve after a modification of the curve comprising the deletion of the reference vertex. According to the invention, the initial position of the point is defined in two complementary ways: by its distance from the reference vertex, measured along the curve or a function thereof ("primary specification"), and by its position within the three-dimensional scene, i.e. with respect to a reference frame of said scene. The primary specification is used as long as the reference vertex exists. If the curve is modified without deleting the reference vertex, the point is repositioned according to the primary specification, i.e. by keeping a constant distance from the reference vertex, and the recorded value of its position within the three-dimensional scene is updated accordingly. If the reference vertex is deleted, however, the stored position within the three-dimensional scene is used to reposition the point in an "optimal" way, i.e. by placing it on the curve at a position which minimizes the distance from its previously-stored position within the three-dimensional scene ("secondary specification").

An object of the present invention is then a computer-implemented method for designing a three-dimensional modeled object comprising the steps of:
  providing, in a three-dimensional scene, said three-dimensional modeled object comprising a curve defined by a set of vertices and a set of edges connecting said vertices;
  placing a point on the curve;
  storing an initial position of the point on the curve, relative to a first vertex;
  storing an initial position of the point within the three-dimensional scene; and
  modifying the curve by deleting the first vertex;
  characterized in that it further comprises:
  placing the point onto the modified curve at a modified position situated at a minimal distance from the stored initial position of the point within the three-dimensional scene.

According to particular embodiments of the invention:
  The method may further comprise a step of modifying the curve again after the deletion of the first vertex, said step comprising changing the position of the point in the three-dimensional scene such that it remains on the curve and at a minimal distance from the stored initial position of the point within the three-dimensional scene.
  The method may further comprise a step of modifying the curve before the deletion of the first vertex, said step comprising changing the position of the point in the three-dimensional scene such that it remains on the curve and that its position with respect to said first vertex remains unchanged, and storing said changed position of the point in the three-dimensional scene.
  The method may further comprise a step of modifying the curve by restoring said first vertex, said step further comprising changing the position of the point in the three-dimensional scene such that it remains on the curve and takes the stored initial position with respect to the first vertex, and storing said changed position of the point in the three-dimensional scene.
  The initial position of the point on the curve relative to a first vertex may be defined as the distance between the point and the first vertex measured along the curve, or a function thereof (e.g. a multiple or a capped value of the distance).

Said three-dimensional modeled object may be a geometrical model of a physical object.

Another object of the invention is a method of manufacturing a physical object comprising: a computer-implemented design step, carried out by implementing a method as defined above; and a step of physically manufacturing said physical object according to said design. Said step of physically manufacturing the physical object may be performed using conventional techniques.

Another object of the invention is a computer program product, stored on a non-volatile computer-readable data-storage medium, comprising computer-executable instructions to cause a computer system to carry out a method as defined above.

Another object of the invention is a non-volatile computer-readable data-storage medium containing computer-executable instructions to cause a computer system to carry out a method as defined above.

Another object of the invention is a Computer Aided Design system comprising a processor coupled to a memory and a graphical user interface, the memory storing computer-executable instructions to cause the Computer Aided Design system to carry out a method as defined above.

BRIEF DESCRIPTION OF THE DRAWINGS

The foregoing will be apparent from the following more particular description of example embodiments of the invention, as illustrated in the accompanying drawings in which like reference characters refer to the same parts throughout the different views. The drawings are not necessarily to scale, emphasis instead being placed upon illustrating embodiments of the present invention.

Additional features and advantages of the present invention will become apparent from the subsequent description, taken in conjunction with the accompanying drawings, which show.

DETAILED DESCRIPTION OF THE INVENTION

A description of example embodiments of the invention follows.

The teachings of all patents, published applications and references cited herein are incorporated by reference in their entirety.

Hereafter, a "three-dimensional" (or "3D") modeled object will be an object, or rather its digital representation in a computer system, allowing a three-dimensional (3D) graphical representation. A 3D representation allows the viewing of the part from all angles. For example, a 3D modelled object, when 3D represented, may be handled and turned around any of its axes, or around any axis in the screen on which the representation is displayed. A three-dimensional scene is constituted by a plurality of 3D modeled objects disposed in a three-dimensional space.

Figure 1A:
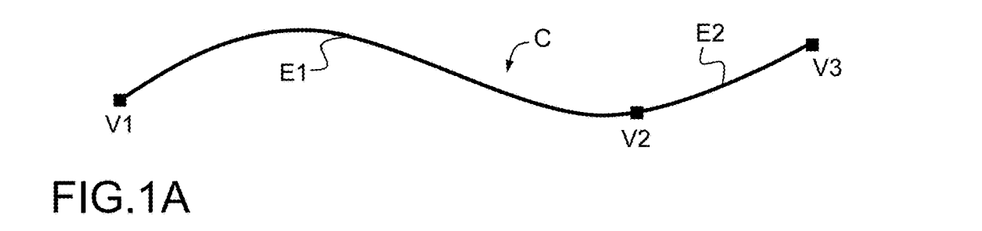
FIG. 1A, a digitally modeled curve formed by vertices and edges.
Figure 1B:
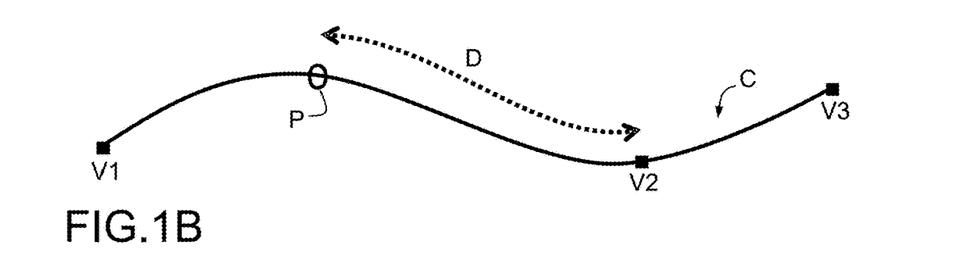
FIG. 1B, such a curve with a point placed on it and positioned with respect to a reference vertex.

FIG. 1A shows a curve C constituted by three vertices V1, V2 and V3 and two edges E1 (linking V1 and V2) and E2 (linking V2 and V3). The edges E1 and E2 are curved segment, defined e.g. by polynomials, in which case curve C is a so-called "spline". In other embodiments, E1 and E2 might be straight segments, in which case curve C would be a so-called "polyline". FIG. 1B shows a point P placed on curve C, and more particularly on segment E1. Point P is positioned relative to vertex V2, which constitutes its "reference vertex". Its position on curve C is defined by the (signed) distance D from the reference vertex, measured along the curve; for instance, D may be negative if (as in the present case) point P is positioned toward vertex V1 and positive if it is positioned toward vertex V3. In other words, the position of point P is defined by a tuple (C, V2, D) comprising three elements: an identifier of the curve C on which it lies, an identifier of the vertex of the curve which serves as reference vertex, and a distance from said reference vertex.

If curve C is modified without deleting the reference vertex V2 (e.g. by deleting another vertex, by moving vertices without deleting them and/or by changing the shapes of the edges), the position of point P is recomputed automatically: the point remains on the curve, at a constant distance D from the reference vertex. This is not possible, however, if the reference vertex is deleted; in this case, according to the prior art, point P keeps its position within the three-dimensional scene to which the curve belongs, and finds itself outside the curve. This is illustrated on FIG. 2, where reference C' designate a modified curve, obtained from curve C by deletion of vertex V2; V1', V3' are the vertices of the modified curve C'.

FIGS. 3A to 3D illustrates different steps of a method according to the invention.

Figure 2:
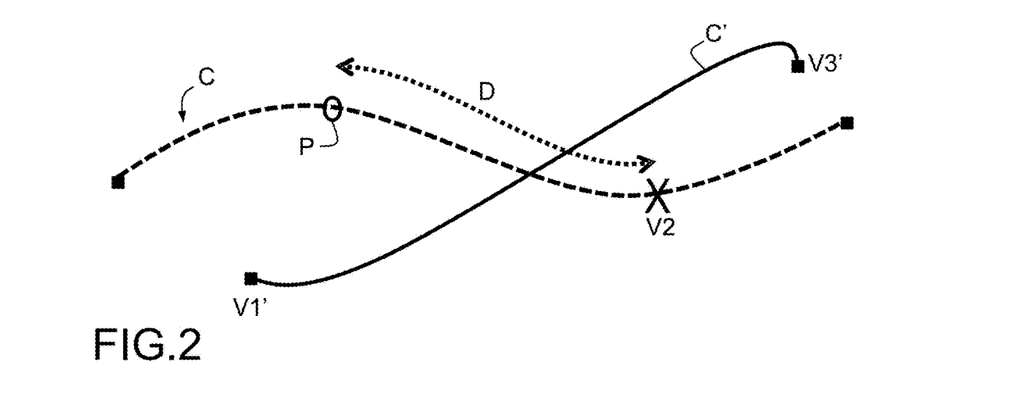
FIG. 2, the consequence of the deletion of a reference vertex according to the prior art.
Figure 3A:
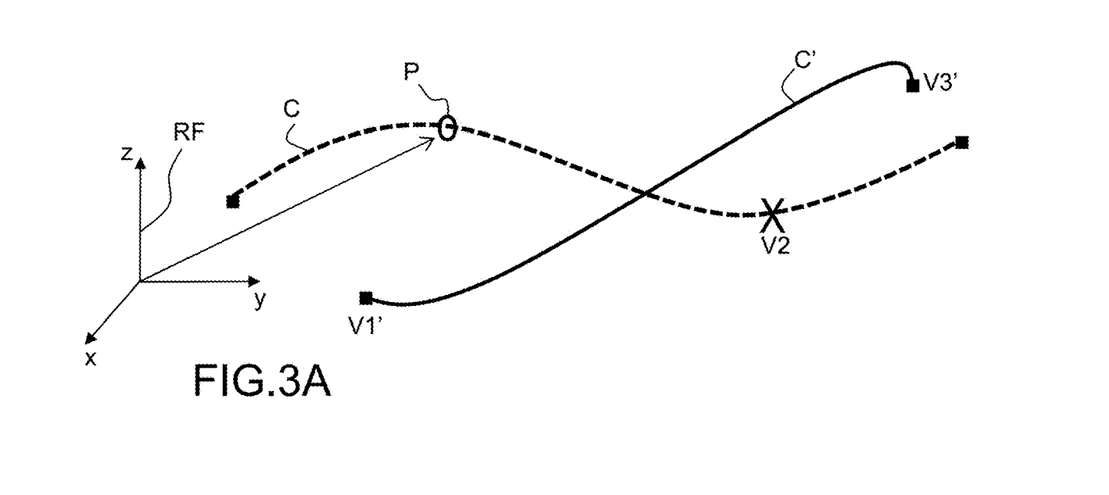
FIGS. 3A, 3B, 3C and 3D, different steps of a method according to an embodiment of the invention.

FIG. 3A is similar to FIG. 2: it shows the situation immediately after a modification of curve C including the deletion of vertex V2, which serves as a reference for point P. This time, however, the initial position of point P is defined in two different ways: by the tuple (C, V2, D), as in the prior art, and by its coordinates (x, y, z) within the three-dimensional scene, i.e. by its position with respect to a reference frame RF of said scene. The tuple (C, V2, D) constitutes the "primary specification" of the point, and is used whenever the reference vertex V2 exists. After the deletion of V2, however, only the coordinates (x, y, z) are meaningful.

Figure 3B:
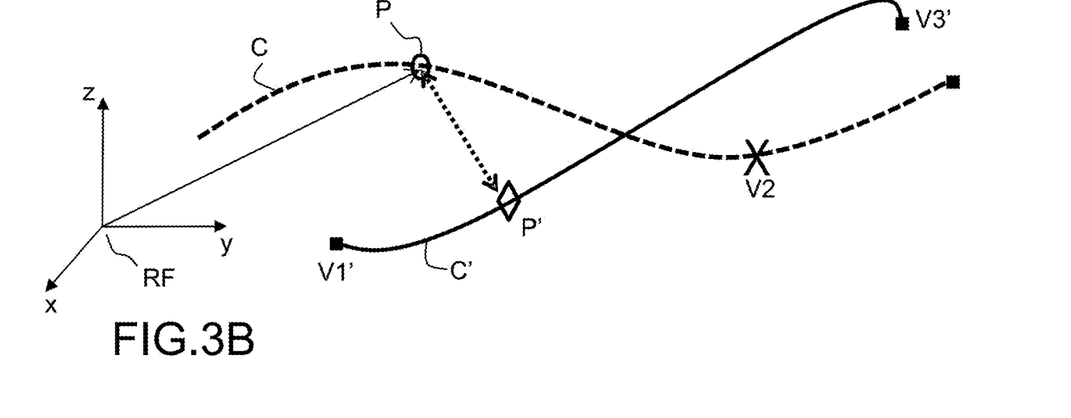

As illustrated on FIG. 3B, the coordinates (x, y, z) are used to reposition the point P on the modified curve C', at a position which is the closest to the initial one ("secondary specification"). In other words, the repositioned point P' has coordinates (x', y', z') relative to reference frame RF such that $\|(x', y', z')-(x, y, z)\|$ is minimized under the constraint $(x', y', z') \in C'$, $\|\cdot\|$ being a norm, typically the Euclidean one. Often, but not necessarily in all cases, P' will be a normal projection of P onto the modified curve C'. It is possible that several points of the modified curve will be situated at a same distance from (x, y, z); in this case, preferably, an error message will be displayed, and the user will be allowed to manually select one of these points. Other solutions, such as the random choice of one of the equidistant points by the system, are also possible.

Figure 3C:
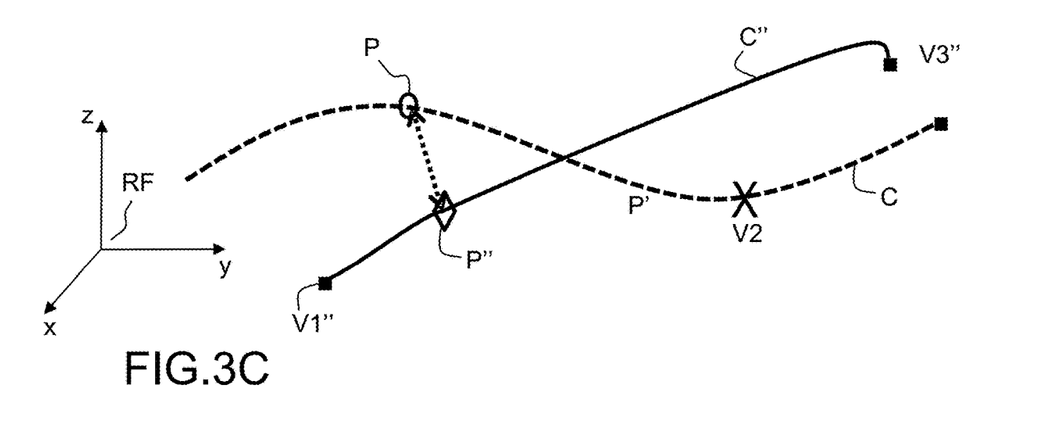
Figure 3D:
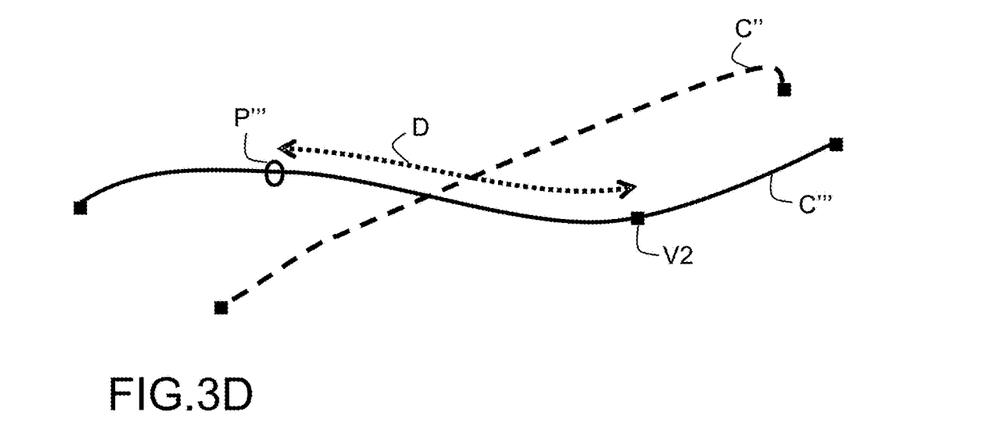

As illustrated on FIG. 3C, the curve can be modified again (reference C", vertices V1", V2"). In this case, a new position P"=(x", y", z") of the point on the modified curve C" is recomputed automatically such that $\|(x", y", z")-(x, y, z)\|$ is minimized under the constraint $(x", y", z") \in C"$. In other words, at any time, the position of the point according to the secondary specification is determined as a function of its position within the three-dimensional scene immediately before the deletion of the reference vertex.

A further modification of the curve may consist in the restoration of reference vertex V2. In this case, as illustrated on FIG. 3D, the primary specification is meaningful again, and takes precedence over the secondary one. Therefore, the point (now identified by reference P''') takes a new position on the modified curve (now identified by reference C''') which is situated at a distance D from the restored reference vertex V2. The new coordinates (x''', y''', z''') of the point with respect with reference frame RF are stored, in order to allow the computation of a new secondary specification in case V2 is deleted again.

Figure 4:
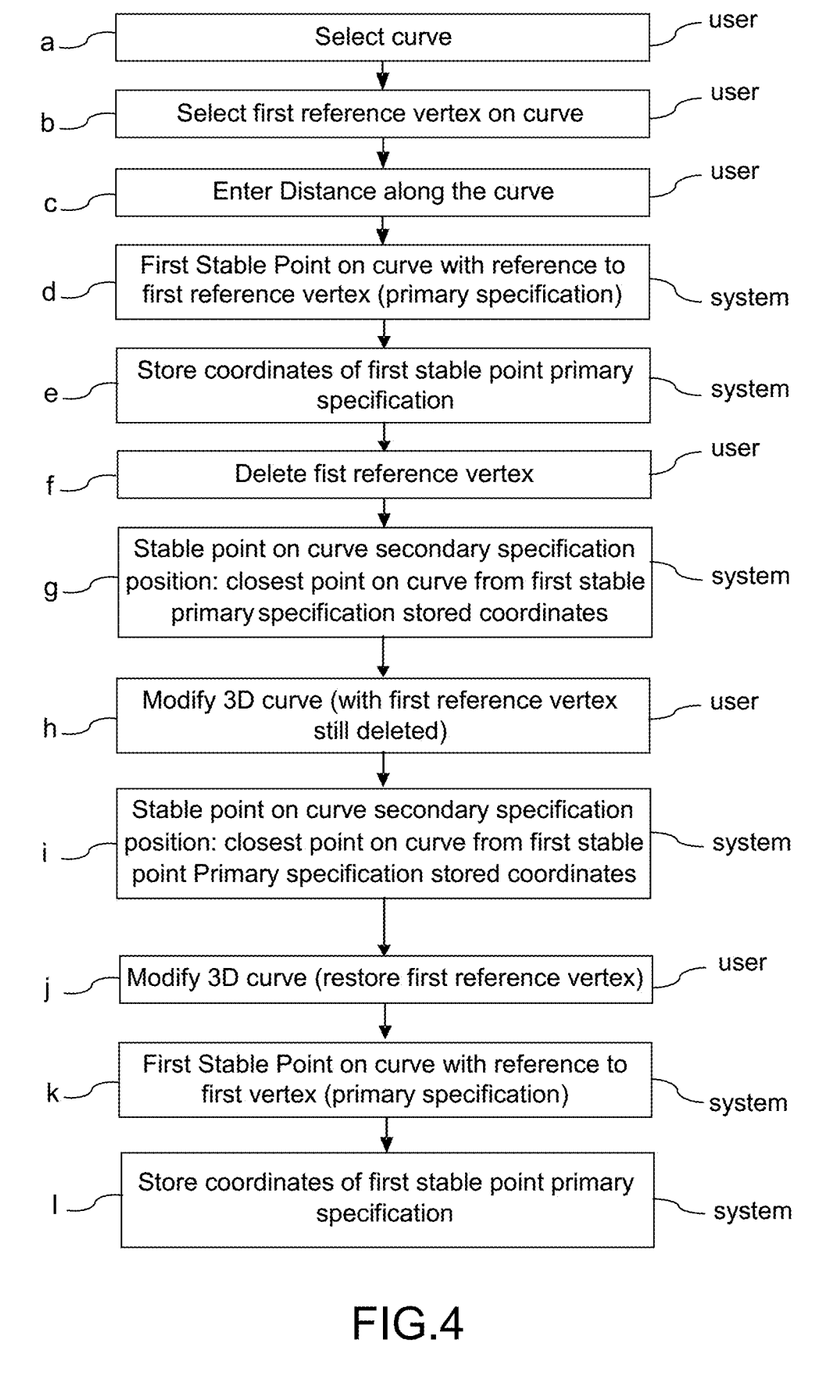
FIG. 4, a flow-chart of a method according to an embodiment of the invention.

FIG. 4 is a flow-chart of a method according to an embodiment of the invention, whose steps correspond to the operations already discussed in relation to FIGS. 3A-3D. On FIG. 4 it is indicated which steps are performed by a (human) user and which ones are performed automatically by the CAD system. It can be seen that user intervention is required for the initial definition of the curve, of the reference vertex and the point; modifications of the curve may be performed either by the user or automatically; and the replacement of the point following a modification of the curve is automatic. In some embodiments, however, the user will also have the possibility of manually replacing a point if the automatic placement is considered unsatisfactory.

In the flow-chart of FIG. 4:

Step a), performed by the user, is the selection of a curve C of a three-dimensional scene, on which a point P will be placed. The selection may be performed using a pointing device such as a mouse pointer.

Step b), also performed by the user, is the selection of a reference vertex of the curve. This selection too may be performed using a pointing device such as a mouse pointer.

Step c), also performed by the user, is the entry of a distance from the reference vertex at which the point will be placed. For instance, the selection of the reference vertex (step b) may prompt the display of a dialog window in which the distance may be entered.

Step d), automatically performed by the system, is the placement of the point, at the required distance from the selected reference vertex, i.e. according to the "primary specification". The point is called "Stable Point on curve" to underline the fact that it remains on the curve (i.e. is "stable") even if the reference vertex is subsequently deleted.

Step e), also automatically performed by the system, consists in storing the coordinates of the point, as defined by the primary specification, within the three-dimensional scene.

Step f), usually performed by the user is a modification of the curve including the deletion of the reference vertex. The deletion may be performed using a pointing device such as a mouse pointer.

Step g), automatically performed by the system, is the repositioning of the point on the curve, at a position which minimizes the distance from the stored coordinates of the primary specification. This corresponds to the secondary specification of the point; see FIG. 3B.

Step h), usually performed by the user, consists in a further modification of the curve, not including a restoration of the reference vertex. For instance, the user may "click" on a point of an edge and "drag" it to change the shape of the edge, or may reposition a vertex by "dragging and dropping" it. As for step f), in some case the modification of the curve may be automatically performed by the system. See FIG. 3C.

Step i), automatically performed by the system, consists in repositioning the point at a position on the modified curve which minimizes the distance from the stored coordinates of the primary specification.

Step j), usually performed by the user, consists in a further modification of the curve, including a restoration of the reference vertex. The restoration may also be performed using a pointing device such as a mouse pointer. As for steps f) and h), in some case the restoration of the reference vertex may result from a modification of the curve automatically performed by the system.

Step k), automatically performed by the system, consists in repositioning the point on the curve according to the primary specification, which is meaningful again due to the restoration of the reference vertex. See FIG. 3D.

Step l), automatically performed by the system, consists in storing the new coordinate of the point within the three-dimensional scene.

Figure 5A:
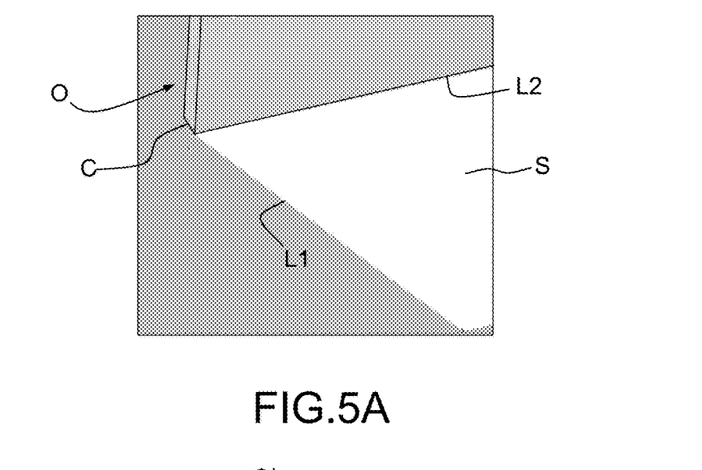
FIGS. 5A, 5B and 5C, an illustration of an improvement provided by the invention over the prior art.
Figure 5B:
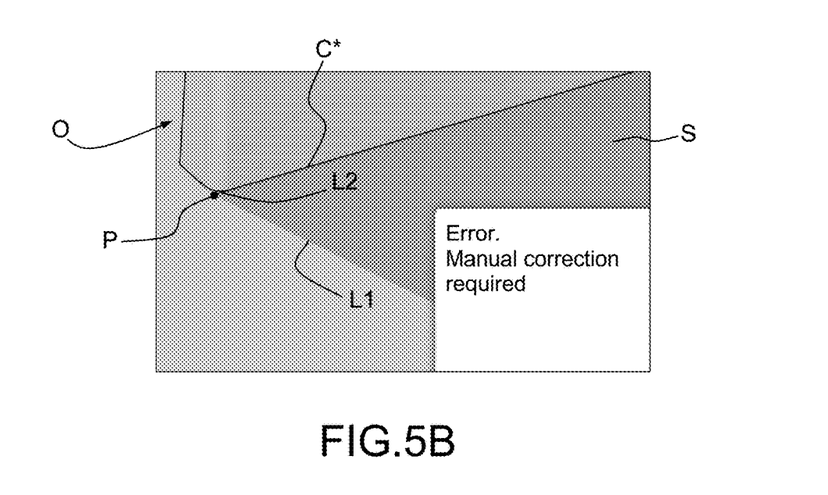

FIG. 5A shows a three-dimensional scene generated by a CAD system, said scene comprising a three-dimensional modeled object O which represents a physical object to be manufactured. For instance, object O may be an element of an injection mold which will be used to produce parts made of plastics. The scene also comprises a surface S, which may represent a separation surface of the injection mold. Surface S is defined by two straight lines L1, L2 which meet at a point P. The latter is supposed to lie on a curve C formed by two consecutive edges of object O. The designer, user of the CAD system, decides to modify object O by creating a fillet, i.e. by rounding one of its edges. This implies a modification of curve C and, more particularly, the deletion of one of its vertices, which serves as reference for point P (in this particular case, the reference vertex is also a vertex of the object, and coincides with point P, otherwise stated D=0). If a method according to the prior art is used, point P no longer lies on the modified curve C* and surface S is semi-detached from object O, which is clearly unacceptable if the surface if the separation surface of a mold. This is detected by the system as an error condition, and a message is displayed indicating that manual correction from the user is required. This situation is illustrated on FIG. 5B. If a method according to the invention is used, instead, point P is automatically repositioned on the modified curve C*, surface S maintains an acceptable configuration and no error condition is detected.

It can then be seen that the inventive method simplifies and accelerate the design of physical objects, which can subsequently be manufactured in a conventional way.

The inventive method can be performed by a suitably-programmed general-purpose computer or computer system, possibly including a computer network, storing a suitable program in non-volatile form on a computer-readable medium such as a hard disk, a solid state disk or a CD-ROM and executing said program using its microprocessor(s) and memory.

Figure 6:
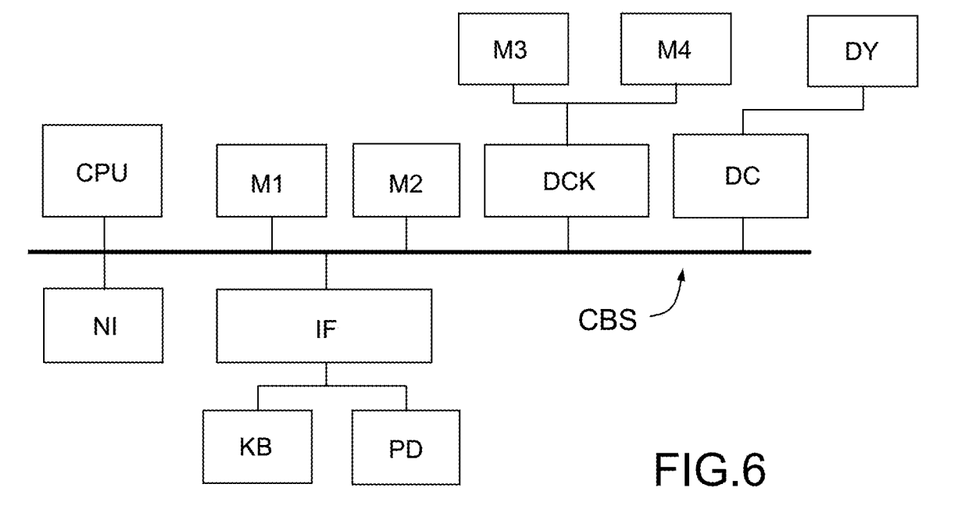
FIGS. 6 and 7, block diagrams of respective computer systems suitable for carrying out a method according to different embodiments of the invention.

A computer—more precisely a Computer Aided Design system, or station—suitable for carrying out a method according to an exemplary embodiment of the present invention is described with reference to FIG. 6. In FIG. 6, the computer includes a Central Processing Unit CPU which performs the processes described above. The process can be stored as an executable program, i.e. a set of computer-readable instructions in memory, such as RAM M1 or ROM M2, or on hard disk drive (HDD) M3, DVD/CD drive M4, or can be stored remotely. Moreover, one or more computer files defining the three-dimensional scene comprising the curve C and the point P may also be stored on one or more of memory devices M1 to M4, or remotely. In particular, the tuple (C, V2, D) constituting the primary specification of the point P and its coordinates (x, y, z) within the three-dimensional scene, may be recorded by RAM memory M1.

The claimed invention is not limited by the form of the computer-readable media on which the computer-readable instructions and/or the digital files of the inventive process are stored. For example, the instructions and files can be stored on CDs, DVDs, in FLASH memory, RAM, ROM, PROM, EPROM, EEPROM, hard disk or any other information processing device with which the Computer Aided Design or illustration authoring station communicates, such as a server or computer. The program and the files can be stored on a same memory device or on different memory devices.

Further, a computer program suitable for carrying out the inventive method can be provided as a utility application, background daemon, or component of an operating system, or combination thereof, executing in conjunction with CPU 800 and an operating system such as Microsoft VISTA, Microsoft Windows 8, UNIX, Solaris, LINUX, Apple MAC-OS and other systems known to those skilled in the art.

The Central Processing Unit CPU can be a Xenon processor from Intel of America or an Opteron processor from AMD of America, or can be other processor types, such as a Freescale ColdFire, IMX, or ARM processor from Freescale Corporation of America. Alternatively, the Central Processing Unit can be a processor such as a Core2 Duo from Intel Corporation of America, or can be implemented on an FPGA, ASIC, PLD or using discrete logic circuits, as one of ordinary skill in the art would recognize. Further, the Central Processing Unit can be implemented as multiple processors cooperatively working to perform the computer-readable instructions of the inventive processes described above.

Figure 5C:
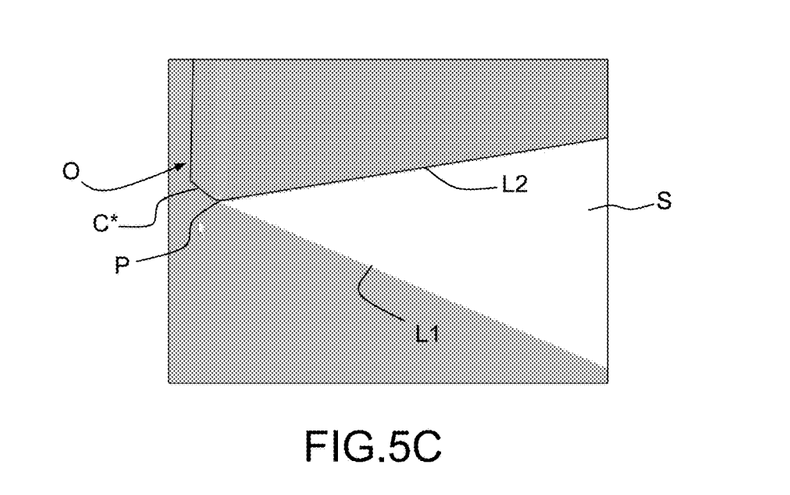

The Computer Aided Design or illustration authoring station in FIG. 5 also includes a network interface NI, such as an Intel Ethernet PRO network interface card from Intel Corporation of America, for interfacing with a network, such as a local area network (LAN), wide area network (WAN), the Internet and the like. The Computer Aided Design station further includes a display controller DC, such as a NVIDIA GeForce GTX graphics adaptor from NVIDIA Corporation of America for interfacing with display DY, such as a Hewlett Packard HPL2445w LCD monitor. A general purpose I/O interface IF interfaces with a keyboard KB and pointing device PD, such as a roller ball, mouse, touchpad and the like. The display, the keyboard and the pointing device, together with the display controller and the I/O interfaces, form a graphical user interface, used by the user to provide input commands—e.g. to move the pointer tool, select a curve or a vertex . . . —and by the Computer Aided Design station for displaying the three-dimensional scene including curve.

Disk controller DKC connects HDD M3 and DVD/CD M4 with communication bus CBS, which can be an ISA, EISA, VESA, PCI, or similar, for interconnecting all of the components of the Computer Aided Design station.

A description of the general features and functionality of the display, keyboard, pointing device, as well as the display controller, disk controller, network interface and I/O interface is omitted herein for brevity as these features are known.

Figure 7:
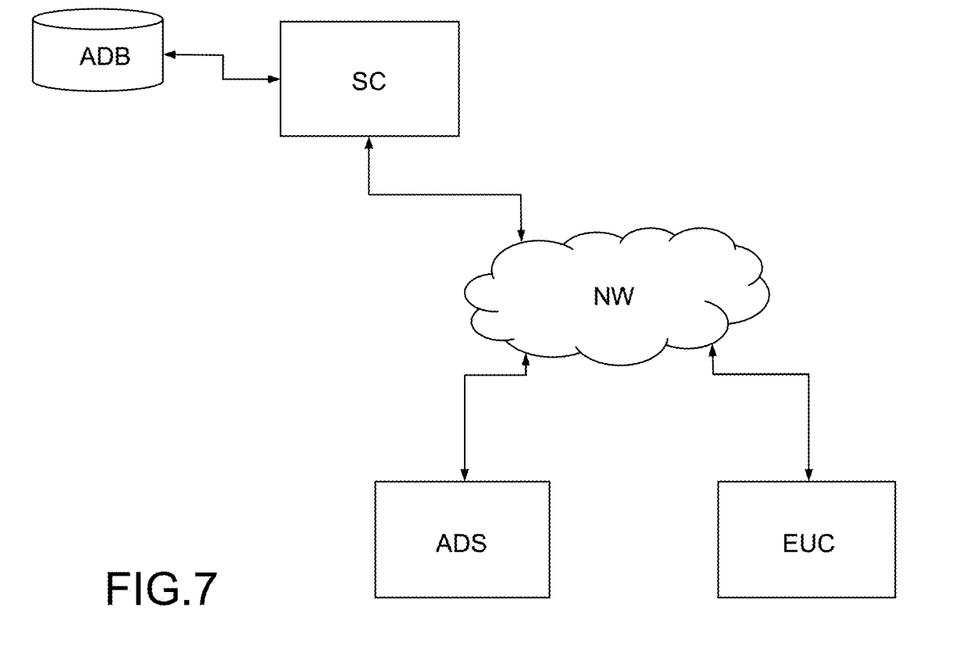

FIG. 7 is a block diagram of a computer system suitable for carrying out a method according to a different exemplary embodiment of the present invention.

In FIG. 7, the executable program EXP and the computer files defining the three-dimensional scene including curve C and point P are stored on memory devices connected to a server SC. The memory devices and the overall architecture of the server may be the same as discussed above with reference to FIG. 6, except that display controller, display, keyboard and/or pointing device may be missing in the server.

The server SC is then connected to an administrator system ADS and end user computer EUC via a network NW.

The overall architectures of the administrator system and of the end user computer may be the same as discussed above with reference to FIG. 6, except that the memory devices of the administrator system and the end user computer do not store the executable program EXP and/or the computer files defining the three-dimensional scene. However, the end user computer does store a client program designed for cooperating with the executable program of the server, as it will be discussed below.

As can be appreciated, the network NW can be a public network, such as the Internet, or a private network such as an LAN or WAN network, or any combination thereof and can also include PSTN or ISDN sub-networks. The network NW can also be wired, such as an Ethernet network, or can be wireless such as a cellular network including EDGE, 3G and 4G wireless cellular systems. The wireless network can also be Wi-Fi, Bluetooth, or any other wireless form of communication that is known. Thus, the network NW is merely exemplary and in no way limits the scope of the present advancements.

The client program stored in a memory device of the end user computer and executed by a CPU of the latter accesses, via the network NW, a database DB stored by the server SC and containing files defining three-dimensional scenes or elements thereof. This allows an end user to open and possibly modify such a file, e.g. by placing a point on a curve of the scene and/or by modifying said curve. The server performs the processing as described above, and transmits to the end user computer an image file corresponding to the desired representation of the scene, again using the network NW.

Although only one administrator system ADS and one end user system EUX are shown, the system can support any number of administrator systems and/or end user systems without limitation. Similarly, multiple servers can also be implemented in the system without departing from the scope of the present invention.

Any processes described herein should be understood as representing modules, segments, or portions of code which include one or more executable instructions for implementing specific logical functions or steps in the process, and alternate implementations are included within the scope of the exemplary embodiment of the present invention.

While this invention has been particularly shown and described with references to example embodiments thereof, it will be understood by those skilled in the art that various changes in form and details may be made therein without departing from the scope of the invention encompassed by the appended claims.

What is claimed is:

1. A computer-implemented method for designing a three-dimensional modeled object comprising the steps of:
providing, in a three-dimensional scene, said three-dimensional modeled object comprising a curve defined by a set of vertices and a set of edges connecting said vertices;
placing a point on the curve;
storing an initial position of the point on the curve, relative to a first vertex;
storing an initial position of the point within the three-dimensional scene;
modifying the curve by deleting the first vertex;
placing the point onto the modified curve at a modified position situated at a minimal distance from the stored initial position of the point within the three-dimensional scene; and
modifying the modified curve to create a further modified curve after the deletion of the first vertex, said modifying the modified curve to create a further modified curve comprising changing the position of the point in the three-dimensional scene such that it remains on the further modified curve and at a minimal distance from the stored initial position of the point within the three-dimensional scene.

2. The computer-implemented method of claim 1, further comprising a step of:
modifying the curve before the deletion of the first vertex, said step comprising changing the position of the point in the three-dimensional scene such that it remains on the curve and that its position with respect to said first vertex remains unchanged, and storing said changed position of the point in the three-dimensional scene.

3. The computer-implemented method of claim 1, further comprising a step of:
modifying the further modified curve to create a thrice modified curve by restoring said first vertex, said step further comprising changing the position of the point in the three-dimensional scene such that it remains on the thrice modified curve and takes the stored initial position with respect to the first vertex, and storing said changed position of the point in the three-dimensional scene.

4. The computer-implemented method of claim 1, wherein the initial position of the point on the curve relative to the first vertex is defined as a distance between the point and the first vertex measured along the curve, or a function thereof.

5. The computer-implemented method of claim 1, wherein said three-dimensional modeled object is a geometrical model of a physical object.

6. A method of manufacturing a physical object comprising:
a computer-implemented design step, carried out by implementing a method to create a design of the physical object comprising:
providing, in a three-dimensional scene, a three-dimensional modeled object, the three-dimensional modeled object being a geometrical model of the physical object comprising a curve defined by a set of vertices and a set of edges connecting said vertices;
placing a point on the curve;
storing an initial position of the point on the curve, relative to a first vertex;
storing an initial position of the point within the three-dimensional scene;
modifying the curve by deleting the first vertex;
placing the point onto the modified curve at a modified position situated at a minimal distance from the stored initial position of the point within the three-dimensional scene; and
modifying the modified curve to create a further modified curve after the deletion of the first vertex, said modifying the modified curve to create a further modified curve comprising changing the position of the point in the three-dimensional scene such that it remains on the further modified curve and at a minimal distance from the stored initial position of the point within the three-dimensional scene, thereby creating the design; and
a step of physically manufacturing said physical object according to said design.

7. A computer program product, comprising:
a) a non-volatile non-transitory computer-readable data-storage medium storing computer-executable instructions that design a three-dimensional modeled object;
b) the computer-executable instructions including instructions to cause a computer system to:
provide, in a three-dimensional scene, said three-dimensional modeled object comprising a curve defined by a set of vertices and a set of edges connecting said vertices;
place a point on the curve;
store an initial position of the point on the curve, relative to a first vertex;
store an initial position of the point within the three-dimensional scene;
modify the curve by deleting the first vertex;
place the point onto the modified curve at a modified position situated at a minimal distance from the stored initial position of the point within the three-dimensional scene; and
modify the modified curve to create a further modified curve after the deletion of the first vertex, said modifying the modified curve to create a further modified curve comprising changing the position of the point in the three-dimensional scene such that it remains on the further modified curve and at a minimal distance from the stored initial position of the point within the three-dimensional scene.

8. A non-volatile non-transitory computer-readable data-storage medium comprising:
a) a memory area embodying computer-executable instructions for designing a three-dimensional modeled object;
b) the computer-executable instructions including instructions that cause a computer system to:
provide, in a three-dimensional scene, said three-dimensional modeled object comprising a curve defined by a set of vertices and a set of edges connecting said vertices;
place a point on the curve;
store an initial position of the point on the curve, relative to a first vertex;
store an initial position of the point within the three-dimensional scene;
modify the curve by deleting the first vertex;
place the point onto the modified curve at a modified position situated at a minimal distance from the stored initial position of the point within the three-dimensional scene; and modify the modified curve to create a further modified curve after the deletion of the first vertex, said modifying the modified curve to create a further modified curve comprising changing the position of the point in the three-dimensional scene such that it remains on the further modified curve and at a minimal distance from the stored initial position of the point within the three-dimensional scene.

9. A Computer Aided Design system comprising:
a) a processor coupled to a memory and a graphical user interface;
b) the memory storing computer-executable instructions that cause the Computer Aided Design system to design a three-dimensional modeled object by:
  i) providing, in a three-dimensional scene, said three-dimensional modeled object comprising a curve defined by a set of vertices and a set of edges connecting said vertices;
  ii) placing a point on the curve;
  iii) storing an initial position of the point on the curve, relative to a first vertex;
  iv) storing an initial position of the point within the three-dimensional scene;
  v) modifying the curve by deleting the first vertex;
  vi) placing the point onto the modified curve at a modified position situated at a minimal distance from the stored initial position of the point within the three-dimensional scene; and
  vii) modifying the modified curve to create a further modified curve after the deletion of the first vertex, by changing the position of the point in the three-dimensional scene such that it remains on the further modified curve and at a minimal distance from the stored initial position of the point within the three-dimensional scene.

10. A computer aided design system as claimed in claim 9, the memory further comprising instructions to cause the Computer Aided Design system to:
modify the further modified curve to create a thrice modified curve by restoring said first vertex, by changing the position of the point in the three-dimensional scene such that it remains on the thrice modified curve and takes the stored initial position with respect to the first vertex, and storing said changed position of the point in the three-dimensional scene.

11. A computer aided design system as claimed in claim 9, the memory further comprising instructions to cause the Computer Aided Design system to:
modify the curve before the deletion of the first vertex, by changing the position of the point in the three-dimensional scene such that it remains on the curve and that its position with respect to said first vertex remains unchanged, and storing said changed position of the point in the three-dimensional scene.

12. A computer aided design system as claimed in claim 9 wherein the initial position of the point on the curve relative to the first vertex is defined as a distance between the point and the first vertex measured along the curve, or a function thereof.

13. A computer aided design system as claimed in claim 9 wherein said three-dimensional modeled object is a geometrical model of a physical object.

* * * * *

UNITED STATES PATENT AND TRADEMARK OFFICE
CERTIFICATE OF CORRECTION

PATENT NO. : 10,497,183 B2
APPLICATION NO. : 15/410300
DATED : December 3, 2019
INVENTOR(S) : Pierre Voirin and Laurent Bianchi Page 1 of 1

It is certified that error appears in the above-identified patent and that said Letters Patent is hereby corrected as shown below:

On the Title Page

Item (54) and in the Specification, Column 1 Line 4 Replace "Place" with --Placed--

Item (72) Replace "Marseilles" with --Marseille--

Signed and Sealed this
Twenty-eighth Day of January, 2020

Andrei Iancu
*Director of the United States Patent and Trademark Office*